(12) United States Patent
Jiang

(10) Patent No.: US 9,766,403 B2
(45) Date of Patent: Sep. 19, 2017

(54) APPARATUS AND METHOD FOR TUNING AND SWITCHING BETWEEN OPTICAL COMPONENTS

(71) Applicant: Zhiping Jiang, Kanata (CA)

(72) Inventor: Zhiping Jiang, Kanata (CA)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 15/099,985

(22) Filed: Apr. 15, 2016

(65) Prior Publication Data

US 2017/0010419 A1    Jan. 12, 2017

Related U.S. Application Data

(63) Continuation-in-part of application No. 14/793,210, filed on Jul. 7, 2015.

(51) Int. Cl.
| | |
|---|---|
| *G02B 6/26* | (2006.01) |
| *G02B 6/293* | (2006.01) |
| *H04Q 11/00* | (2006.01) |
| *H01S 5/125* | (2006.01) |

(Continued)

(52) U.S. Cl.
CPC ..... *G02B 6/29395* (2013.01); *G02B 6/29338* (2013.01); *H01S 5/062* (2013.01); *H01S 5/125* (2013.01); *H01S 5/5027* (2013.01); *H04Q 11/0005* (2013.01); *H04Q 2011/0016* (2013.01)

(58) Field of Classification Search
None
See application file for complete search history.

(56) References Cited

U.S. PATENT DOCUMENTS

| | | |
|---|---|---|
| 5,404,240 A | 4/1995 | Nishio et al. |
| 5,589,967 A | 12/1996 | Auffret |
| 6,172,782 B1 | 1/2001 | Kobayashi |

(Continued)

FOREIGN PATENT DOCUMENTS

| | | |
|---|---|---|
| CN | 1273755 A | 11/2000 |
| CN | 102136876 A1 | 10/2016 |
| WO | WO9914879 A2 | 3/1999 |

OTHER PUBLICATIONS

U.S. Office Action from U.S. Appl. No. 14/793,210, dated May 5, 2016, 8 pages.

(Continued)

*Primary Examiner* — Sung Pak

(57) ABSTRACT

Apparatuses and methods for tuning and switching between optical components are provided. The apparatuses and methods may be used in the context of optical communication. An example apparatus may include a first optical path having a first tunable component and a second optical path having a second tunable component. The apparatus may also include a first switch component for selectively connecting the first optical path to an output, and a second switch component for selectively connecting the second optical path to the output. The first and second switch components may be semiconductor optical amplifiers (SOAs). The apparatus may have a controller that controls the first switch component and the second switch component to select which optical path is connected to the output and controls tuning of the tunable component in the optical path that is not connected to the output.

24 Claims, 8 Drawing Sheets

(51) Int. Cl.
*H01S 5/062* (2006.01)
*H01S 5/50* (2006.01)

(56) References Cited

U.S. PATENT DOCUMENTS

| | | |
|---|---|---|
| 7,248,803 B2 | 7/2007 | Kikushima |
| 2001/0013934 A1 | 8/2001 | Varnham et al. |
| 2001/0050807 A1 | 12/2001 | Deguchi et al. |
| 2002/0057860 A1 | 5/2002 | Cormack |
| 2002/0063927 A1 | 5/2002 | Ofek et al. |
| 2005/0068631 A1 | 3/2005 | Liu |
| 2008/0253767 A1 | 10/2008 | Galli |
| 2009/0273842 A1 | 11/2009 | Socci |
| 2011/0080591 A1* | 4/2011 | Johnson ............ G01B 9/02069 356/479 |
| 2012/0162659 A1* | 6/2012 | Goldberg ........... G01N 21/4795 356/479 |

OTHER PUBLICATIONS

"Controlling the S7500 CW Tunable Laser", Finisar Corporation, Document AN-2095, Rev A, Nov. 10, 2011, pp. 1-10.

* cited by examiner

APPARATUS AND METHOD FOR TUNING AND SWITCHING BETWEEN OPTICAL COMPONENTS

PRIORITY CLAIM

This application claims priority as a continuation-in-part to U.S. application Ser. No. 14/793,210, filed on Jul. 7, 2015, entitled "Apparatus and Method for Tuning Optical Components", the entire disclosure of which is hereby incorporated by reference.

FIELD

The present disclosure relates generally to tuning and switching between optical components for optical communication.

BACKGROUND

In modern optical communication systems, the bandwidth of channels provided along optical fibers may be relatively large. For example, a single optical channel may have a bandwidth of 100 Gbps or more.

A number of techniques are known for making use of the bandwidth available in optical fibers. In some techniques, a large number of individual channels may be carried within a fiber, each channel operating at a particular wavelength. An example of this is Dense Wavelength Division Multiplexing (DWDM). In some DWDM systems, 80 or more wavelengths may be carried within a fiber. Multi-wavelength sources capable of generating dozens of wavelengths simultaneously, such as quantum dot lasers, may be used to generate the large number of individual channels carried within a fiber.

In a basic communication network, a network of N nodes may be interconnected by N·(N−1) unidirectional links in order to allow direct communication between each of the N nodes. However, given the large bandwidth of modern optical channels, the use of a full set of N·(N−1) unidirectional links to interconnect N nodes may be impractical and/or unnecessary. Various practical networking configurations are known for optical networks in which N nodes may be interconnected by fewer than N·(N−1) links, and where bandwidth is dynamically shared along each provided link. One method of sharing bandwidth of a link is Time Division Multiplexing (TDM). In some TDM systems, the wavelengths carried along a particular fiber link are changed on a per timeslot basis.

SUMMARY

An apparatus and method for tuning optical components is provided. A first optical path having a first tunable component is provided, and a second optical path having a second tunable component is provided. The tunable components may, for example, be tunable lasers or tunable filters. A switch selectively connects the first optical path or the second optical path to an output. A controller controls the switch to select which optical path is connected to the output and controls tuning of the tunable component in the optical path that is not connected to the output.

Another embodiment has a plurality of wavelength selector modules connected together in sequence. Each wavelength selector module has a first tunable component having a through port and an optical output, a second tunable component having a through port and an optical output; and a switch for selectively connecting an optical path between a selected one of the tunable components and an output of the wavelength selector module. A multi-wavelength source is coupled to the first tunable component and the second tunable component of a first wavelength selector module of the plurality of wavelength selector modules. A controller controls the switch in each wavelength selector module, and controls tuning of the tunable component in each wavelength selector module that is not the selected tunable component of that wavelength selector module.

Another embodiment provides a method that begins with connecting a first optical path having a first tunable component to an output. A signal is transmitted from the first tunable component to the output. While the first optical path is connected to the output, a second tunable component is tuned. After tuning the second tunable component, a second optical path having the second tunable component is connected to the output. After this, a signal is transmitted from the second tunable component to the output.

Another embodiment provides an apparatus including a first optical path having a first tunable component and a second optical path having a second tunable component. The apparatus also includes a first switch component for selectively connecting the first optical path to an output, and a second switch component for selectively connecting the second optical path to the output. A controller controls the first switch component and the second switch component to select which optical path is connected to the output and controls tuning of the tunable component in the optical path that is not connected to the output.

Another embodiment provides an optoelectronic package. The package includes a first tunable laser coupled to a first semiconductor optical amplifier (SOA). The first SOA is selectively operable to suppress light from the first tunable laser. The package also includes a second tunable laser coupled to a second SOA. The second SOA is selectively operable to suppress light from the second tunable laser. The package also includes an optical coupler that connects outputs of the first and second SOAs to an output of the package.

Another embodiment provides a method that begins with connecting a first optical path having a first tunable component to an output. A second optical path having a second tunable component is disconnected from the output. A signal is transmitted from the first tunable component to the output. While the second optical path is disconnected from the output, the second tunable component is tuned. After tuning the second tunable component, the second optical path is connected to the output, and the first optical path is disconnected from the output. After this, a signal is transmitted from the second tunable component to the output.

BRIEF DESCRIPTION OF THE DRAWINGS

Examples of embodiments will be described in greater detail with reference to the accompanying drawings, in which.

DETAILED DESCRIPTION

Figure 1:
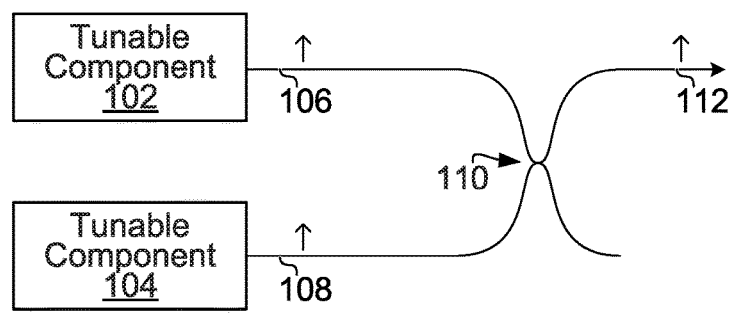
FIG. 1 is a block diagram of an apparatus having tunable optical components in accordance with an embodiment of the invention.

FIG. 1 is a block diagram of an apparatus having tunable optical components in accordance with an embodiment of the invention. In the example illustrated, a first tunable component 102 has an optical output 106 and a second tunable component 104 has an optical output 108. Optical outputs 106 and 108 are coupled to a switch 110 having a switch output 112. Although a set of two tunable components is depicted in FIG. 1, in some embodiments there may be more than two tunable components coupled to a switch having more than two inputs.

Each tunable component 102,104 is one or a combination of:

a tunable laser which can emit light at a particular tuned wavelength;

a tunable optical filter for filtering light at a particular wavelength received from a light source (not shown); and/or another type of tunable optical component.

Examples of tunable optical filters that might be used in the embodiment of FIG. 1 and in other embodiments described herein include MRRs (micro-ring resonators, also known as micro resonant rings) and cavity resonators, such as a fabric powered cavity resonators using microelectromechanical system (MEMS) technology. These identified types of optical filters are intended as examples, and it should be understood that embodiments using other types of tunable optical filters are also contemplated.

In some embodiments, tunable components 102, 104 are tunable by frequency tuning. For example, a tunable laser may have a tunable frequency, and a tunable filter may be tunable by adjusting tunable frequency parameters such as center frequency and bandwidth. In other embodiments, tunable components 102, 104 are tunable by phase tuning or a combination of frequency and phase tuning.

Different physical mechanisms may be relied upon to achieve the tuning. In some embodiments, tunable components 102, 104 are tunable by carrier injection. In some embodiments, tunable components 102, 104 are tunable by thermal tuning.

Switch 110 is controlled to selectively connect a first optical path having tunable component 102 to the switch output (in which case switch output 112 is optical output 106), or connect a second optical path having tunable component 108 to the switch output (in which case switch output 112 is optical output 108).

In a given period that the switch is in a given state, the tunable component whose output is used as the switch output 112 may be referred to as being part of a working path. In the same given period, the other tunable component may be referred to as being part of a tuning path. During the given period, the tunable component in the working path and the switch 110 produce the overall output 112 of the apparatus. During the given period, the tunable component in the tuning path can be tuned without affecting the output of the working path. The tunable component of the tuning path is not being used for active communication, and the tunable component can be tuned if necessary, for communication during the subsequent period. However, it is not necessarily the case that the tunable component is tuned every possible time. For example, where the tunable component in the tuning path performs wavelength selection, and there is no change in the selected wavelength between a preceding period during which the tunable component was in the working path and a subsequent period during which the tunable component will be in the working path, it is not necessary to tune the tunable component. As noted previously, examples of this tuning include tuning laser output frequency, filter center frequency and/or bandwidth, and phase. At a transition time at the conclusion of the current period, the switch 110 switches so that the current working path becomes the tuning path for the next period, and so that the current tuning path becomes the working path for the next period. The output of the apparatus during the next period is the output of the new working path, having been tuned during the previous period, if necessary. Thus, the apparatus illustrated in FIG. 1 produces a tuned signal at switch output 112 for each period. In embodiments where tunable components 102, 104 are tuned in frequency, producing a tuned signal at switch output 112 for each period may be referred to as frequency switching.

In a conventional system in which a single tunable component is used to select a frequency (or other tunable parameter) of the output signal, the time needed to switch between different frequencies depends on how long it takes to tune the tunable component. Advantageously, with the described system, the time it takes to switch between different frequencies is no longer a function of how long it takes to tune the tunable component. This is because the tuning takes place on a path that is not currently being used to generate the output signal. In some embodiments, the switch 110 has a switching time that is faster than a tuning time of tunable components 102, 104. In some embodiments, switch 110 may be a silicon photonic switch. In some embodiments, switch 110 may be an electro-optic switch.

Furthermore, by using one tunable component for transmission while the other tunable component is tuned, the required performance characteristics of the tunable components may be relaxed in comparison to making use of only a single tunable component. For example, in a communication system with 5 μs TDM time slots and a 50 ns guard time between periods, if only a single tunable component were used for communication, the single tunable component would need to tune to a new wavelength for each new slot within 50 ns. In comparison, with the embodiment depicted in FIG. 1, each tunable component would have, approximately, the length of the 5 μs slot duration in order to be tuned. In this example, the required tuning speed of the tunable components is relaxed by approximately 100 times.

Relaxing the tuning speed of the tunable components may allow the use of lower cost tunable components, allow accurate frequency tuning, and/or allow stable frequency tuning. For example, in some embodiments, thermal tuning may be used in place of carrier injection tuning, even though the use of thermal tuning may be slower than carrier injection tuning. Typically, carrier injection can tune on the order of nanoseconds, whereas thermal tuning takes on the order of microseconds. An advantage of thermal tuning relative to carrier injection tuning is that thermal tuning typically results in less optical loss.

With the embodiment of FIG. 1, there may be a controller (not shown) that controls tuning of the tunable components 102, 104 and switching of the switch 110. In some embodiments, the controller may also monitor tuning being performed, for example in a feedback loop to allow accurate frequency tuning.

Figure 2:
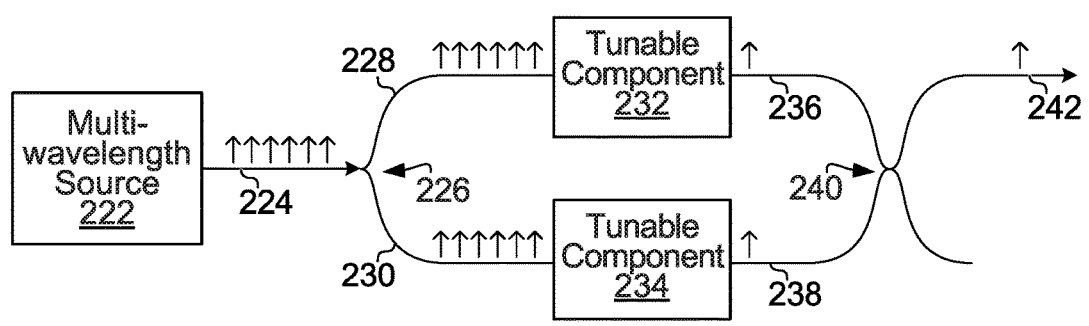
FIG. 2 is a block diagram of another apparatus having tunable optical components in accordance with an embodiment of the invention.

FIG. 2 is a block diagram of another apparatus having tunable optical components in accordance with an embodiment of the invention. In the example illustrated, a multi-wavelength optical source 222 has an output 224 carrying a multi-wavelength optical signal. The output 224 is coupled via an optical coupler 226 having two outputs 228 and 230 coupled to a first tunable component 232 and a second tunable component 234, respectively. The first tunable component 232 has an optical output 236 and the second tunable component 234 has an optical output 238. Optical outputs 236 and 238 are coupled to a switch 240 having a switch output 242.

Although two tunable components are depicted in FIG. 2, in some embodiments there may be more than two tunable components, which may be coupled to multi-wavelength optical source 222 by a multi-way optical coupler 226 and coupled to a switch 240 having more than two inputs. In a specific example, the tunable components are tunable filters, but more generally other tunable components having a through path may be employed.

Multi-wavelength optical source 222 is a device capable of emitting light at more than one wavelength simultaneously. In some embodiments, multi-wavelength optical source 222 is a quantum dot laser. In other embodiments, multi-wavelength optical source 222 is a coupled array of single-wavelength lasers. Other types of multi-wavelength optical sources are also contemplated.

In some embodiments, optical coupler 226 is an optical splitter. In some embodiments, the optical splitter produces two outputs each having a power that is about 50% of the input power. With this approach, 50% of the power is available for the working path, and 50% of the power is available for tuning. Another type of optical splitter that might be used in some embodiments is a variable power optical splitter. A variable power optical splitter has a variable power in the sense that the division of power between the working path and the tuning path can be changed from one period to the next. For example, the variable power optical splitter can be operated to selectively direct a first larger portion of light received as input to one of outputs 228 and 230 and a second smaller portion of light received as input to the other one of outputs 228 and 230. As a specific example, the larger portion of light may be about 90% of light received as input, and the smaller portion of light may be about 10% of light received as input, although it should be understood that other divisions of light are also contemplated. In a specific example, for each tuning period, the smaller portion of light is directed to the tuning path for use in tuning, and the larger portion of light is directed to the working path.

In some embodiments where there are more than two tunable components 232, 234, the variable power optical splitter receives input light, and operates to direct a first portion (which in some embodiments is a majority portion) of the input light to a selected tunable component. The path containing the selected tunable component becomes the working path. The variable power optical splitter also directs portions of the input light to other tunable components. The other tunable components are in tuning paths. It should be understood that other configurations of the variable power optical splitter are possible.

In some embodiments, tunable components 232 and 234 are capable of being tuned without requiring light as input, which is sometimes referred to as dark tuning. In this case, optical coupler 226 may be an optical switch. When optical coupler 226 is an optical switch, it may operate to selectively direct substantially all of the light received as input to one of outputs 228 and 230.

In some embodiments, each tunable component 232 and 234 is a tunable filter having a passband centered at a desired tuning wavelength established by a tuning process. Each of outputs 236 and 238 contains a respective filtered version of the inputs to tunable components 232 and 234. In some embodiments, the tunable filters are tunable to select a single wavelength of a multi-wavelength input signal. In other embodiments, the tunable filters are tunable to select a fixed number of contiguous wavelengths of a multi-wavelength input signal. In other embodiments, the tunable filters are tunable to select a variable number of contiguous wavelengths of a multi-wavelength input signal.

Thus, output 236 will contain any wavelength(s) of the multi-wavelength input signal contained within the passband of tunable component 232 and output 238 will contain any wavelength(s) of the multi-wavelength input signal contained within the passband of tunable component 234.

As in the embodiment of FIG. 1, for any given period, there is a working path and a tuning path, determined by controlling the switch 240. As before, the tunable component in the tuning path can be tuned without affecting the output of the working path. Again, in the example where tunable components 232, 234 are tunable filters, the apparatus illustrated in FIG. 2 performs wavelength selection by producing a signal at switch output 242 that includes any wavelength(s) of the multi-wavelength source 222 contained within the passband of the tunable filter in the working path. The wavelength selected changes each time a switch in the tuning path and working path is made, for example, for each TDM slot.

If optical coupler 226 is a variable power optical splitter, the variable power optical splitter may be operated in tandem with switch 240 to determine the tuning path and the working path. That is, when the tunable component 232 is in the working path, the variable power optical splitter may direct a majority portion of input light to tunable component 232 (via output 228), and when tunable component 234 is in the working path, the variable power optical splitter may direct a majority portion of input to tunable component 234 (via output 230).

If optical coupler 226 is an optical switch, it may also be operated in tandem with switch 240 to determine the tuning path and the working path. That is, when output 242 contains optical output 236, the optical switch acting as optical coupler 226 may direct incoming light to output 228, and when output 242 contains optical output 238, the optical switch acting as optical coupler 226 may direct incoming light to output 230.

With the embodiment of FIG. 2, there may be a controller (not shown) that controls tuning of the tunable filters 232, 234 and switching of the switch 240. Where coupler 226 is a variable power optical splitter or an optical switch, the controller may also control the coupler 226.

Figure 3:
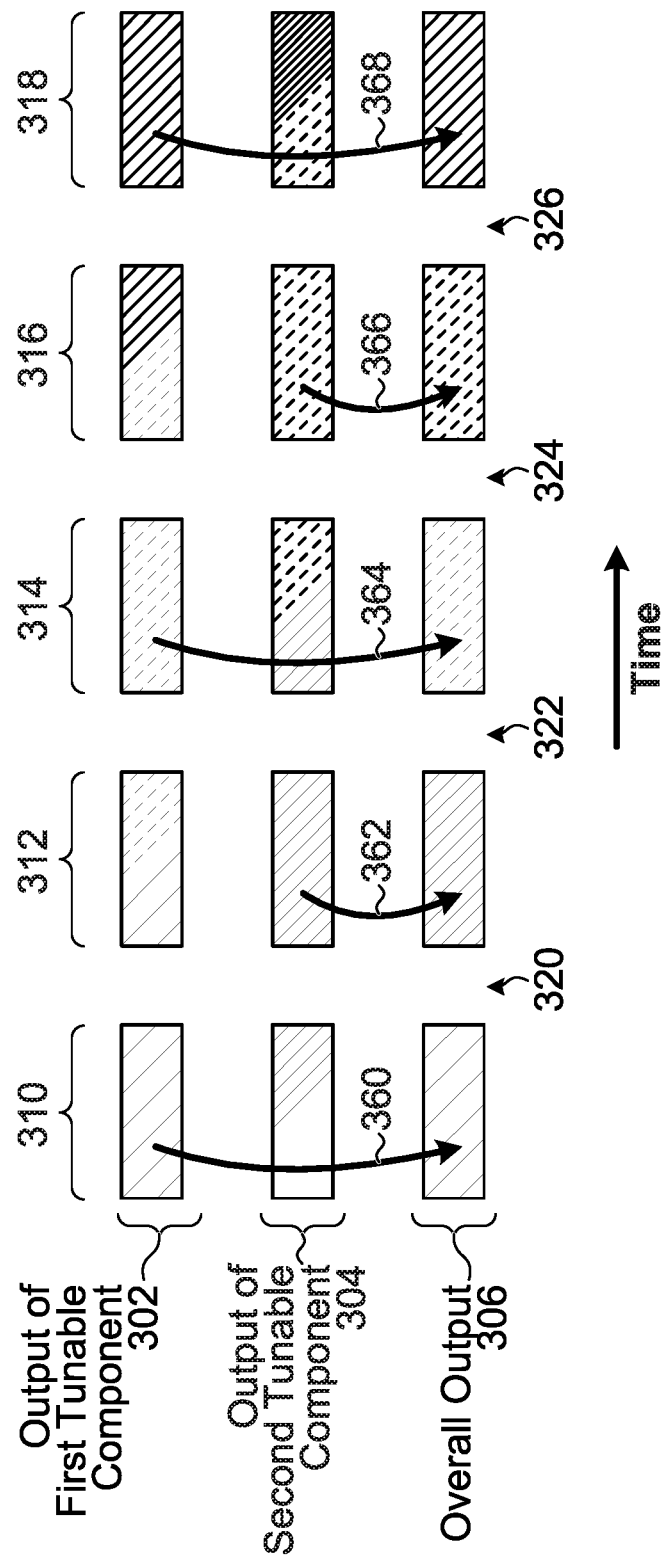
FIG. 3 is a schematic illustration of switching between two paths over time in accordance with an embodiment of the invention.

FIG. 3 is a schematic illustration of switching between a working path and a tuning path in accordance with an embodiment of the invention, such as might take place in the apparatus depicted in FIG. 1 or the apparatus depicted in FIG. 2. Columns 310, 312, 314, 316, and 318 represent successive time periods, with time running from left to right in the Figure. In some embodiments, the time periods may be time slots in a TDM communication scheme. Transition times 320, 322, 324, and 326 between the time periods 310, 312, 314, 316, and 318 are also illustrated. Row 302 represents the output from a first tunable component over time, with hatchings used to represent particular output wavelengths from the first tunable component. Row 304 represents the output from a second tunable component over time, with hatchings used to represent particular output wavelengths from the second tunable component. In rows 302 and 304, time periods during which a tunable component is being tuned are represented by a transition from one hatching to another hatching. The transition in hatching represents a change from being tuned to a first wavelength (the one being used in the preceding period) to a second wavelength (the one required for the subsequent period). Row 306 represents the overall output from the apparatus over time. The hatching in row 306 indicates the wavelength at the output; this will be the wavelength of the first tunable component while the working path contains the first tunable component, and will be the wavelength of the second tunable component while the working path contains the second tunable component. In the illustrated example, during the first, third and fifth time periods 310, 314, 318, the output 306 is from the first tunable component, and during these periods the second tunable component can be tuned without affecting the output of the first tunable component in the working path. During the second and fourth time periods 312, 316, the output 306 is from the second tunable component, and during these periods the first tunable component can be tuned without affecting the output of the second tunable component which is now in the working path.

The pattern of switching between two paths over time depicted in FIG. 3 may continue over time. It should be understood that the depicted pattern of switching between two paths over time is provided only as an example, and that other patterns or sequences of switching are also possible, including irregular sequences. For example, in some embodiments having more than two tunable components, there may be one working path and more than one tuning path at any given time, and the apparatus may switch between paths in a sequence so that each tunable component is in the working path a particular fraction of the time.

Figure 4:
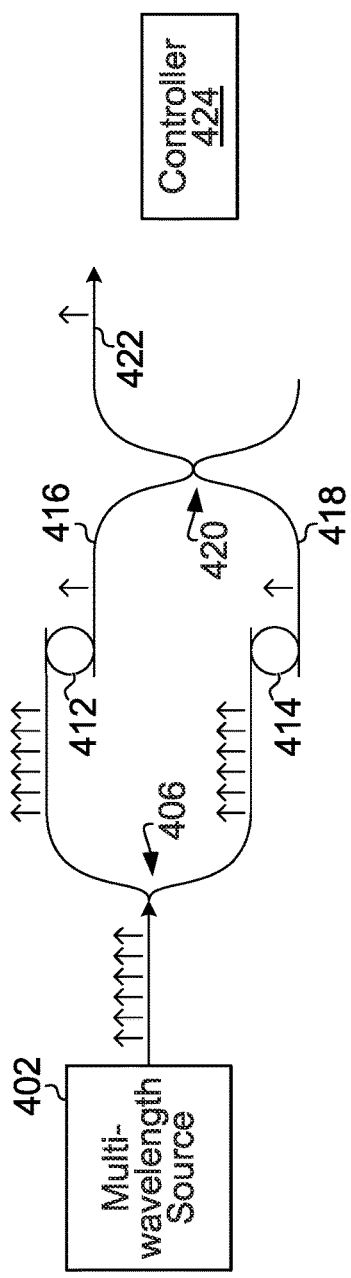
FIG. 4 is a block diagram of a wavelength selection apparatus in accordance with an embodiment of the invention.

FIG. 4 is a block diagram of an apparatus that allows a single wavelength to be selected from a multi-wavelength source 402 in accordance with an embodiment of the invention. The embodiment illustrated is a variation of the embodiment illustrated in FIG. 2, with MRRs used as tunable filters and a controller being illustrated. More specifically, in FIG. 4, an input multi-wavelength source 402 is connected through an optical coupler 406 to tunable components which include a first MRR 412 and a second MRR 414. Each MRR has an input port, a drop port, a through port, and an add port providing optical input, drop, through, and add functions, although all the ports are not necessarily used in every application. In the embodiment shown in FIG. 4, the drop port of the first MRR 412 is provided as an optical output 416 to switch 420. The drop port of the second MRR 414 is provided as an optical output 418 to switch 420.

A controller 424 is coupled to first MRR 412, second MRR 414, and switch 420. As in previously described embodiments, optical coupler 406 may be an optical splitter, such as a variable power optical splitter, or an optical switch. Controller 424 may also be coupled to such a variable power optical splitter or such an optical switch.

Switch 420 is controlled to alternate between connecting a first optical path having MRR 412 to the switch output (in which case switch output 422 is optical output 416) and connecting a second optical path having MRR 414 to the switch output (in which case switch output 422 is optical output 418). Controller 424 controls the tuning of the MRR in the tuning path. As before, the MRR in the tuning path can be tuned without affecting the output of the working path, but during a given period it may or may not be necessary to tune the MRR.

Figure 5:
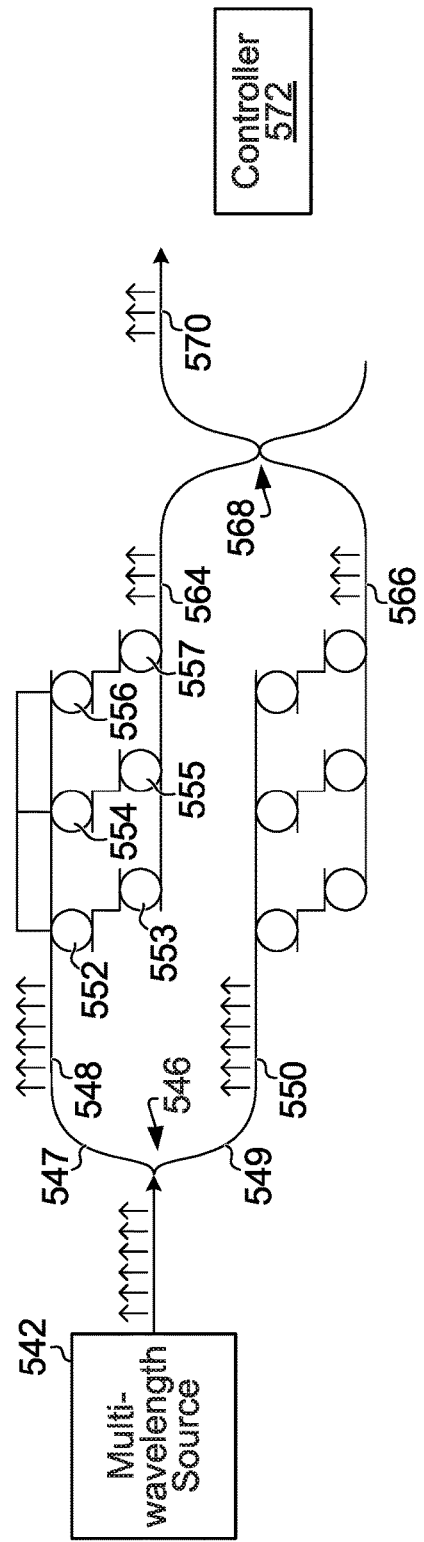
FIG. 5 is a block diagram of another wavelength selection apparatus in accordance with an embodiment of the invention.

FIG. 5 is a block diagram of an apparatus where multiple wavelengths are selected from a multi-wavelength source 542 in accordance with an embodiment of the invention. The embodiment illustrated is a variation of the embodiment illustrated in FIG. 4, with multi-wavelength source 542 connected through optical coupler 546 to an upper path 547 and a lower path 549 being used to select a plurality of wavelengths. In FIG. 5, the upper path 547 contains a first set of three MRRs 552, 554, 556 connected in sequence such that the through port of first MRR 552 is coupled to the input port of second MRR 554, and the through port of second MRR 554 is coupled to the input port of third MRR 556. A second set of three MRRs 553, 555, 557 are also shown connected in sequence with the through port of MRR 553 coupled to the input port of MRR 555 and the through port of MRR 555 coupled to the input port of MRR 557. The drop port of MRR 552 is coupled to add port of MRR 553. The drop port of MRR 554 is coupled to add port of MRR 555, and the drop port of MRR 556 is coupled to the add port of MRR 557. The through port of MRR 557 is provided as output 564 coupled to switch 568. A similar structure is shown for the lower path 549.

A controller 572 is coupled to the MRRs 552, 553, 554, 555, 556, 557 in the upper path, and the MRRs in the lower path. As in previously described embodiments, optical coupler 546 may be a splitter, such as a variable power optical splitter or an optical switch. Controller 572 may also be coupled to such a variable power optical splitter or such an optical switch.

In the depicted embodiment, MRRs 552 and 553 represent a first filter pair, MRRs 554 and 555 represent a second filter pair, and MRRs 556 and 557 represent a third filter pair. Each filter pair may be tuned to select a particular wavelength.

In other embodiments, fewer or more filter pairs may be included, in order to select fewer or more wavelengths, respectively. A similar discussion applies to the MRRs of the lower path. The number of filter pairs in the two paths need not necessarily be equal.

For the purpose of discussion, operation of the upper path 547 will be described by way of example. While the upper path is the working path, a multi-wavelength signal arrives at MRR 552. MRR 552 drops a first selected wavelength and the remaining signal is input to MRR 554. MRR 554 drops a second selected wavelength and the remaining signal is input to MRR 556. MRR 556 drops a third selected wavelength. MRR 553 receives the first selected wavelength on its add port and outputs this on the through port to MRR 555.

MRR 555 combines the received through signal from MRR 553 additively with the second selected wavelength received on its add port and outputs the combined signal on the through port to MRR 557. MRR 557 combines the received through signal with the third selected wavelength received on its add port and outputs the combined signal at 564 which contains the first, second and third selected wavelengths. This combined signal is then output by switch 568 as the overall output of the apparatus at switch output 570. During this time, the lower path is the tuning path, and MRRs of the lower path can be tuned to select three wavelengths to be used in the next period. The signal flow in the tuning path is the same as described above for the working path. However, the combined signal produced as output 566 from the tuning path is not produced at the switch output 570 of the switch 568. During this time, the MRRs in the tuning path can be tuned, if necessary, so as to select the first, second and third wavelengths to be used in the next period, without affecting the output of the working path.

In some alternative embodiments, each filter pair may be connected in parallel to optical splitter 546 or another coupling device, rather than being connected in sequence as illustrated.

Controller 572 controls the operation of switch 568 to connect an optical path from output 564 of the upper path to switch output 570, or to connect an optical path from output 566 of the lower path to switch output 570. Controller 572 also controls the tuning of the MRRs in the tuning path. The MRR pairs in the tuning path at any given time may be referred to as the tuning MRR pairs, and the MRR pairs in the working path may be referred to as the working MRR pairs. Controller 572 controls the tuning of the MRRs in each tuning MRR pair so that the two MRRs within each tuning MRR pair is tuned, if necessary, to a desired wavelength. The working MRR pairs act in concert to filter a set of selected wavelengths, and to provide these wavelengths as input to switch 568, which outputs the filtered wavelengths as the switch output 570. In this manner, the apparatus selects multiple wavelengths from multi-wavelength optical source 542.

Figure 6:
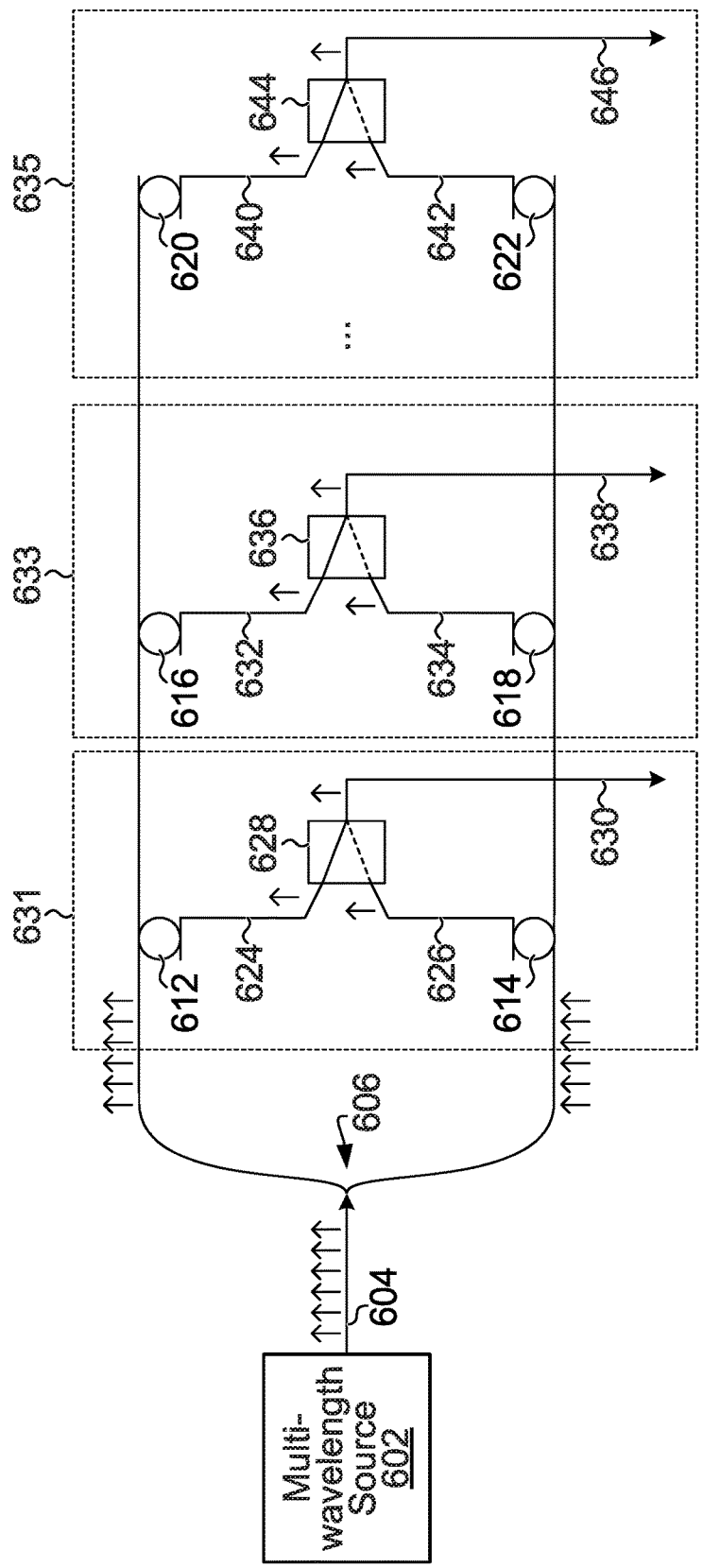
FIG. 6 is a block diagram another wavelength selection apparatus in accordance with an embodiment of the invention.

FIG. 6 is a block diagram of an apparatus where a single wavelength is selected for each of multiple outputs in accordance with an embodiment of the invention. In the illustrated embodiment, a multi-wavelength optical source 602 has an output 604 carrying a multi-wavelength optical signal. The output 604 is coupled via optical splitter 606 to the input port of a MRR 612. MRR 612 has a through port connected to the input port of MRR 616, which in turn has a through port connected to the input port of MRR 620. MRRs 612, 616, 620 have respective drop ports providing optical outputs 624, 632, 640 connected to respective first inputs of switches 628, 636, 644. Similarly, the output 604 of multi-wavelength source 602 is coupled via optical splitter 606 to the input port of a MRR 614 having a through port connected to the input port of MRR 618, which in turn has a through port connected to the input port of MRR 622. MRRs 614, 618, 622 have respective drop ports 626, 634, 642 connected to respective second inputs of switches 628, 636, 644. The switches 628, 636, 644 have respective switch outputs 630, 638, 646.

In the depicted embodiment, MRR 612, MRR 614, and switch 628, as well as optical outputs 624 and 626 and switch output 630, form a first wavelength selector module 631. MRR 616, MRR 618 and switch 636, as well as optical outputs 632 and 634 and switch output 638, form a second wavelength selector module 633. MRR 620, MRR 614, and switch 644, as well as optical outputs 640 and 642 and switch output 646, represent a third wavelength selector module 635. Each wavelength selector module 631,633,635 may be tuned to select a particular wavelength for output from the apparatus. In other embodiments, fewer or more wavelength selector modules may be provided, in order to select fewer or more wavelengths, respectively.

Operation of the first wavelength selector module 631 will be described by way of example. Switch 628 is controlled to selectively connect an optical path between MRR 612 and the switch output 630 or connect an optical path between MRR 614 and the switch output 630. While one MRR of the wavelength selector module is connected to the switch output, the other MRR can be tuned without affecting the output of the MRR connected to the switch output.

A controller (not pictured) may control the operation of each of switches 628, 636, and 644 so that, during each period of a plurality of periods, each switch output 630, 638, and 646 selectively contains one of the optical outputs 624 or 626, 632 or 634, and 640 or 642, respectively. The controller may also control the tuning of the MRRs. In this manner, the apparatus selects multiple wavelengths from multi-wavelength optical source 602 and provides each selected wavelength at an individual switch output of switch outputs 630, 638, 646.

Although each of the wavelength selector modules illustrated in the embodiment of FIG. 6 incorporates a pair of MRRs for selecting a particular wavelength for output along each of switch outputs 628, 636, and 644, respectively, it should be understood that other configurations are possible. For example, a wavelength selector module may have upper and lower paths where each path consists of a plurality of MRRs connected together, for example in the manner illustrated in FIG. 5. In a wavelength selector module where each path consists of a plurality of MRRs connected together, the wavelength selector module may be tuned to select a plurality of wavelengths for output. In an example embodiment where each of the wavelength selector modules may be tuned to select a plurality of wavelengths for output, each of switch outputs 628, 636, and 644 may contain a respective selected plurality of wavelengths.

Figure 7:
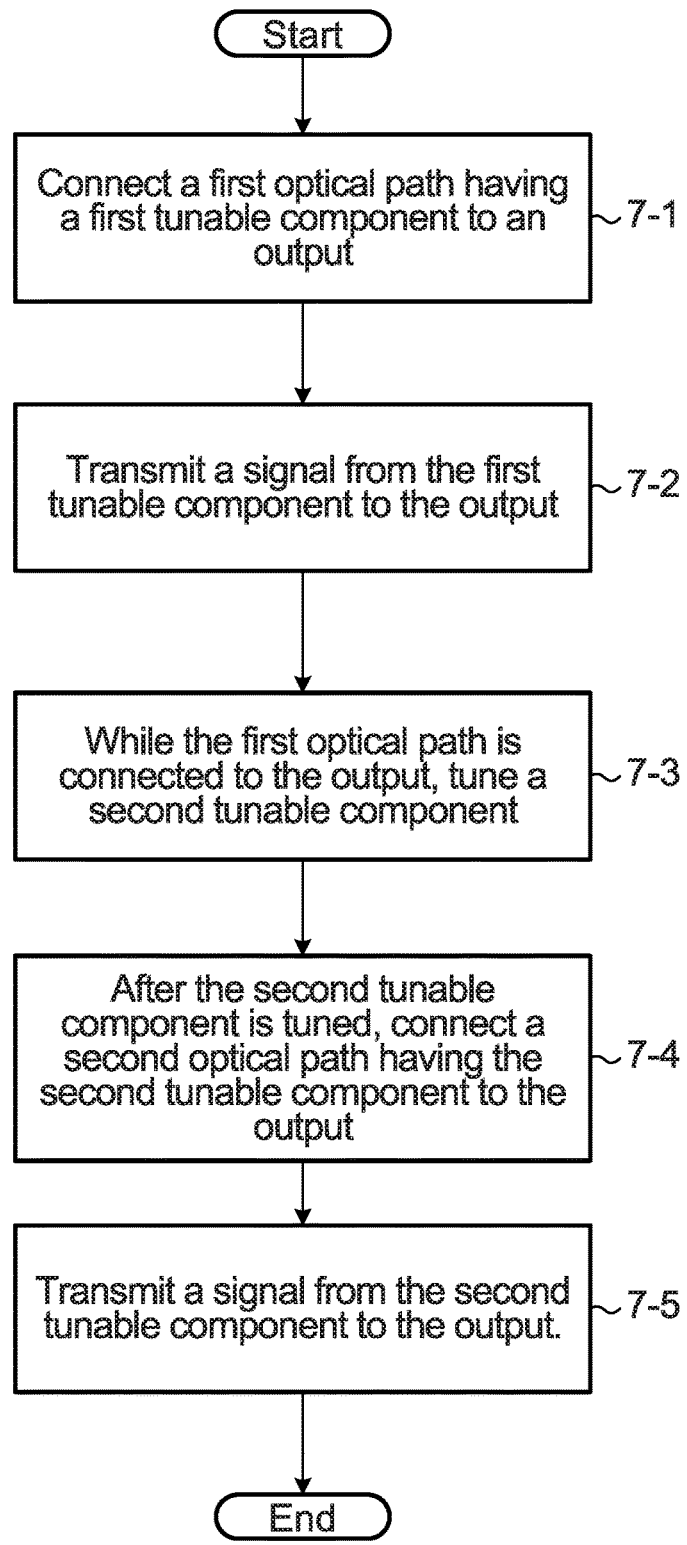
FIG. 7 is a flowchart of a method of tuning optical components in accordance with an embodiment of the invention.

FIG. 7 is a flowchart of a method involving tuning optical components for wavelength switching in accordance with an embodiment of the invention. At 7-1, a switch connects a first optical path having a first tunable component and an output. At 7-2, a signal is transmitted from the first tunable component through the switch to the output. While the signal is transmitted from the first tunable component, at 7-3 a second tunable component is tuned. The switch then connects a second optical path having the second tunable component to the output at 7-4. At 7-5, a signal is transmitted from the second tunable component through the switch to the output.

In embodiments described above that involve the use of a switch to select a frequency (or other tunable parameter) of the output signal, the time it takes to adjust the output signal depends on the switching speed of the particular switch device being used. In some cases, switching devices capable of being toggled between a state that allows light to pass and another state that does not allow light to pass are capable of faster performance than switching devices for switching between multiple inputs. Some toggle-type switching devices also have other advantages, such as smaller size and/or lower power usage.

Figure 8:
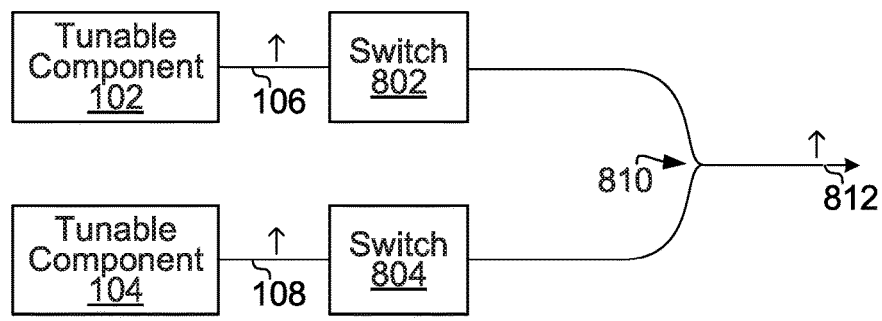
FIG. 8 is a block diagram of another apparatus having tunable optical components in accordance with an embodiment of the invention.

FIG. 8 is a block diagram of an apparatus that is a variation of the apparatus shown in FIG. 1, where the apparatus of FIG. 8 has tunable optical components and toggle-type switch components in accordance with an embodiment of the invention. In the example illustrated, the first tunable component 102 has the optical output 106 and the second tunable component 104 has the optical output 108. Optical output 106 is coupled to a first switch component 802, and optical output 108 is coupled to a second switch component 804. Outputs from the first switch component 802 and the second switch component 804 are coupled to an optical coupler 810 having a coupler output 812. Although a set of two tunable components and two switch components is depicted in FIG. 8, in some embodiments there may be more than two pairs of tunable components and switch components coupled to an optical coupler having more than two inputs.

Each tunable component 102, 104 may be one of the types of tunable components discussed above with respect to FIG. 1. In one example embodiment, tunable components 102, 104 are distributed Bragg reflector (DBR) lasers. In another example embodiment, the tunable components 102, 104 are modulated grating Y-branch (MG-Y) lasers. These identified types of tunable lasers are intended as examples, and it should be understood that embodiments using other types of components tunable in optical frequency are also contemplated.

First and second switch components 802, 804 are components that are selectively controllable to have a state that substantially allows light to pass and another state that substantially does not allow light to pass. In an example embodiment, each of the first and second switch components 802, 804 are semiconductor optical amplifiers (SOA) that can be selectively reverse biased to suppress light from passing from an input of the switch component to its output. When in a reverse biased state, some SOAs may suppress light from passing by 40 dB or more. When not in a reverse biased state, SOAs may allow light to pass depending on configuration and, when forward biased, may amplify light. Some embodiments employ SOAs capable of switching between states in less than 1 nanosecond. Although SOAs are provided as examples of first and second switch components 802, 804, other optical switching devices, including switching devices based on electro-optic, magneto-optic, or mechanical switching mechanisms are also contemplated.

In some embodiments, optical coupler 810 is a 3 dB directional optical coupler having an insertion loss of a least 3 dB. However, it should be understood that optical couplers with other coupling characteristics may also be used.

The first and second switch components 802, 804 are controlled in tandem by a controller (not shown) to select whether the optical path having the first tunable component 102 or the optical path having the second tunable component 104 is connected to pass light through to the coupler output 812. When the first switch 802 is configured to allow light to pass, the second switch 804 is configured to block light, so that coupler output 812 is the optical output 106 of the first tunable component 102. When the second switch 804 is configured to allow light to pass, the first switch 802 is configured to block light, so that coupler output 812 is the optical output 108 of the second tunable component 104. In some embodiments, the controller alternates between configurations of the first and second switches 802, 804 so that coupler output 812 alternates between optical output 106 and optical output 108.

In a given period when the first and second switches 802, 804 are in a given state, the tunable component whose output is used as the coupler output 812 may be referred to as being part of the working path. In the same given period, the other tunable component may be referred to as being part of the tuning path. In a given period, the controller may adjust, if necessary, the tuning of the tunable component that is part of the tuning path in the manner described above with respect to FIG. 1, so that the tunable component that is part of the tuning path can be used for communication with the adjusted tuning during a subsequent period.

In view of the above, it should be understood that the embodiment shown in FIG. 8 is a variation of the embodiment shown in FIG. 1, where switch 110 has been substituted with first and second switches 802, 804 and optical coupler 810. More generally, variations of other embodiments described above can be produced by analogous substitutions. For example, an embodiment representing a variation of the embodiment shown in FIG. 2 is produced by replacing switch 240 with first and second switches 802, 804 and optical coupler 810, the first switch 802 receiving optical output 236 as input, and the second switch 804 receiving optical output 238 as input. Likewise, embodiments representing variations of the embodiments shown in FIGS. 4, 5, and 6 are produced in an analogous manner.

Figure 9:
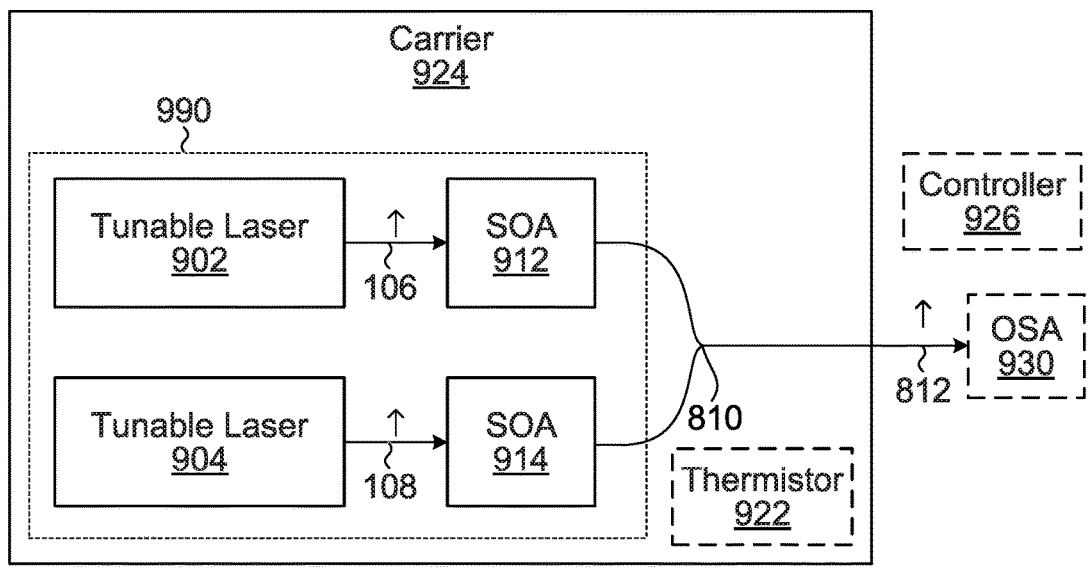
FIG. 9 is a block diagram of an optoelectronic package having tunable lasers and semiconductor optical amplifiers (SOAs) in accordance with an embodiment of the invention.

In some embodiments, the tunable components and the switch components are monolithically integrated. FIG. 9 is a block diagram of an optoelectronic package providing a particular embodiment of the apparatus shown in FIG. 8. In the embodiment shown in FIG. 9, tunable lasers 902, 904 and SOAs 912, 914 are monolithically integrated on an integrated circuit (IC) chip 990. Chip 990 is mounted on a carrier 924 substrate. In typical embodiments, the carrier 924 substrate is semiconductor material. An optical coupler 810 is also mounted on the carrier 924. The output 106 of tunable laser 902 is coupled as input to a first SOA 912, and the output 108 of tunable laser 904 is coupled as input to a second SOA 914. The outputs of SOAs 912, 914 are coupled to inputs of the optical coupler 810, and the optical coupler 810 produces coupler output 812.

A controller 926 directs the operation of tunable lasers 902, 904 and SOAs 912, 914 in the manner previously described with respect to FIG. 8. The controller is located externally to the package and communicates with the package through interface terminals (not shown) on the carrier 924.

In some embodiments, an optional optical sub assembly (OSA) 930 is optically coupled to coupler output 812. The OSA 930 is a series of optical hardware components configured to process light from the optical coupler output 812. In an example embodiment, OSA 930 includes a collimating lens followed by an optical isolator, a beam splitter, and one or more focusing lenses. In some embodiments, OSA 930 is a wavelength locker that measures the wavelength of laser light received from optical coupler output 812. In an example embodiment, OSA 930 provides an output proportional to the wavelength offset from a specific desired wavelength, for example an International Telegraph Union (ITU) standard grid wavelength. In some embodiments, controller 926 may adjust the tuning of tunable lasers 902, 904 in a feedback loop based on an output from OSA 930. However, it should be understood that the particular components of OSA 930 are an application-specific design choice and may vary depending on intended applications of the package.

In some embodiments, an optional thermistor 922 is mounted on the carrier 924. The thermistor 922 allows the controller 926 to monitor temperature characteristics of chip 990 and/or other components mounted on the carrier 924. In some embodiments, the carrier 924 is mounted on an optional thermo-electric cooler (TEC) (not shown). The TEC allows the controller 926 to control the temperature of chip 990 and/or other components mounted on the carrier 924. In embodiments where both thermistor 922 and TEC are mounted on the carrier 924, controller 926 may adjust the operation of TEC in a feedback loop based on a state of thermistor 922 to maintain chip 990 and/or other components mounted on the carrier 924 within a defined temperature range.

It should be understood that the package configuration shown in FIG. 9 is an example, and that other configurations are also contemplated. For example, one or more of optical coupler 810, thermistor 922, or other components may be monolithically integrated onto chip 990. In some embodiments, chip 990 is supplied separately from carrier 924, rather than being mounted to, or supplied together with, carrier 924. Also, while the embodiment shown in FIG. 9 is based on the apparatus shown in FIG. 8, other embodiments may provide packages for other apparatuses described above.

Figure 10:
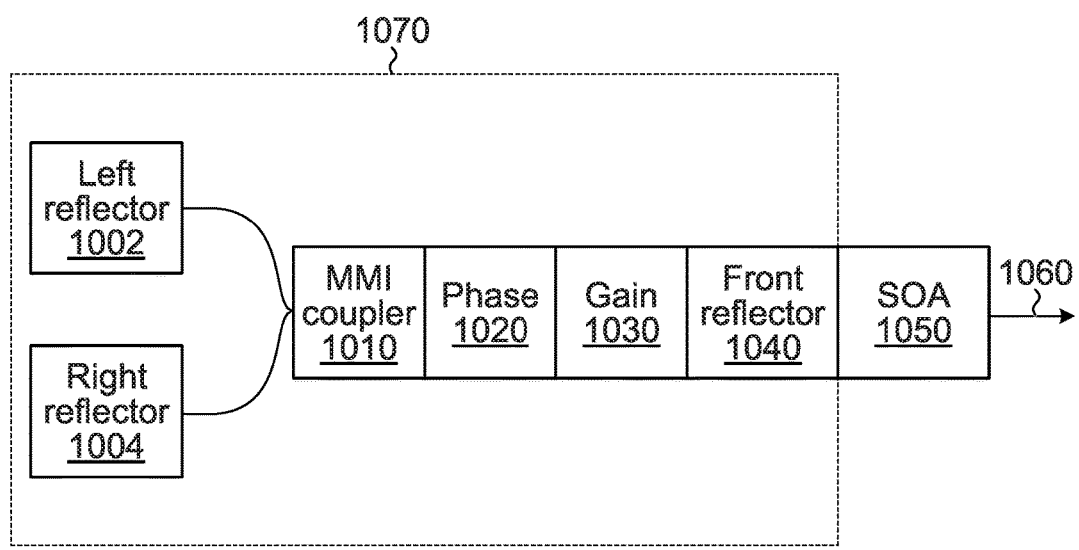
FIG. 10 is a block diagram of an example laser assembly including a SOA for use with some embodiments of the invention.

FIG. 10 is a block diagram of an example laser assembly including a laser section 1070 and a SOA 1050 for use with some embodiments of the invention. In some embodiments of chip 990 of FIG. 9, one instance of the laser assembly shown in FIG. 10 is used as tunable laser 902 and SOA 912 and another instance of the laser assembly is used as tunable laser 904 and SOA 914.

In the example laser assembly illustrated in FIG. 10, laser section 1070 is a modulated grating Y-branch (MG-Y) laser. The MG-Y laser has left and right modulated grating (MG) reflectors 1002, 1004, each coupled to an input port of a multi-mode interference (MMI) coupler 1010. An output port of the MMI coupler 1010 is coupled to a phase adjustment stage 1020 followed by a gain stage 1030, which is then followed by a front reflector 1040. Output from the front reflector 1040 is optically coupled to a SOA 1050. SOA 1050 can provide gain in normal operation, or cause light loss when reversely biased. Light emitted from SOA 1050 is provided as output 1060 from the laser assembly. It should be understood that other types of tunable lasers and/or tunable optical components such as tunable optical filters are substitutable for laser section 1070 in other embodiments.

Figure 11:
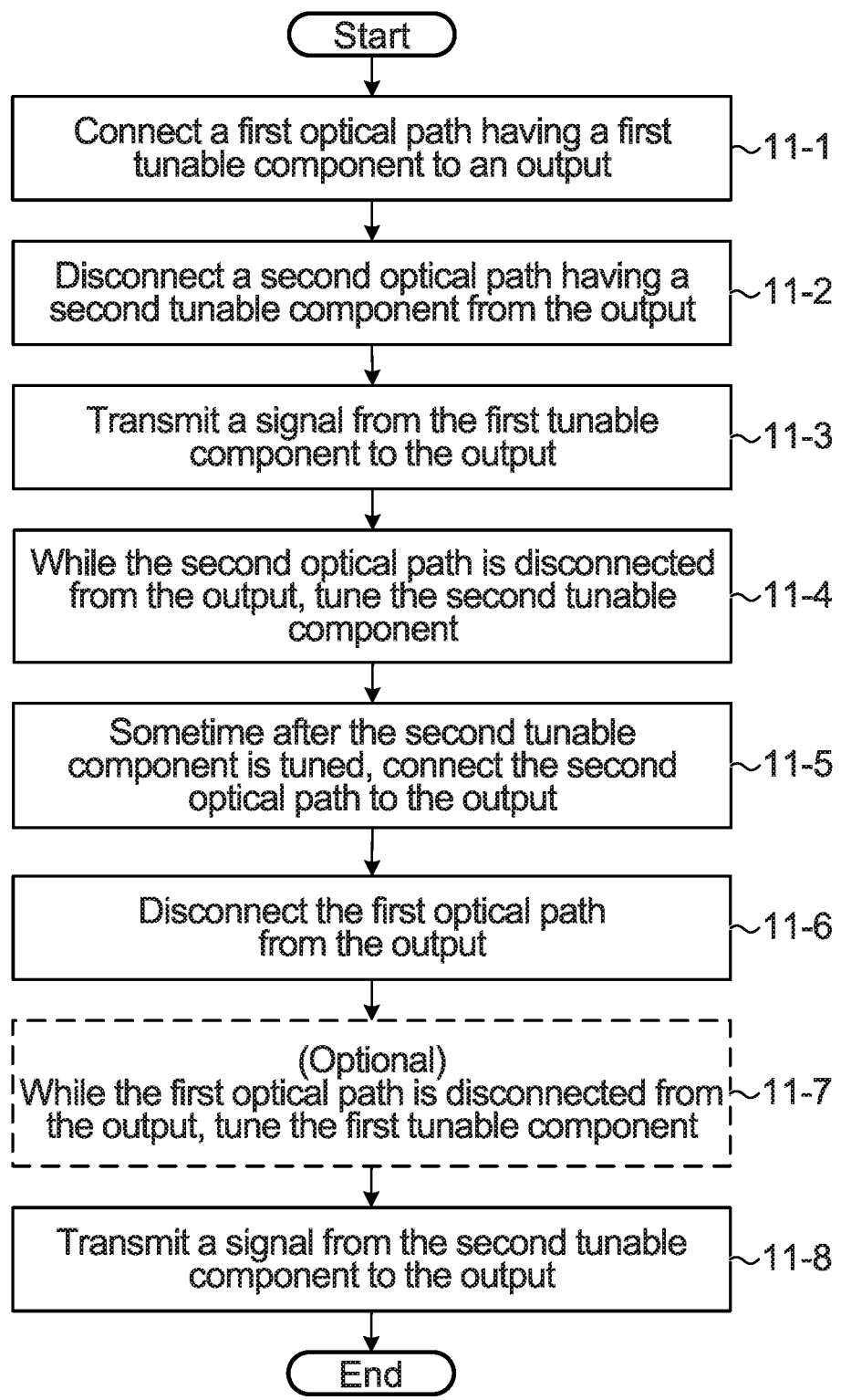
FIG. 11 is a flowchart of a method of tuning and switching between optical components in accordance with an embodiment of the invention.

FIG. 11 is a flowchart of a method of tuning and switching between optical components in accordance with an embodiment of the invention. At 11-1, the first switch 802 connects a first optical path having the first tunable component 102 to the output 812. At 11-2, the second switch 804 disconnects a second optical path having the second tunable component 104 from the output 812. In some embodiments, steps 11-1 and 11-2 are performed simultaneously. At 11-3, a signal is transmitted from the first tunable component 102 to the output 812. While the second optical path is disconnected from the output 812, at 11-4 the second tunable component 104 is tuned. Sometime after the second tunable component 104 is tuned, the second switch 804 then connects the second optical path to the output 812 at 11-5 and the first switch 802 disconnects the first optical path from the output 812 at 11-6, in any order. In other words, the disconnection step 11-6 can be performed before or after the connection step 11-5, or simultaneously with the connection step 11-5. The time at which the connection step 11-5 occurs is determined by application-specific requirements. It should be understood that although the tuning path should have been tuned before the second switch 804 connects the second optical path to the output 812, the second switch 804 need not be switched immediately after the tuning path is tuned. In some embodiments, steps 11-5 and 11-6 are performed simultaneously. Optionally, at 11-7, while the first optical path is disconnected from the output 812, the first tunable component 102 is tuned. At 11-8, a signal is transmitted from the second tunable component 104 through the second switch 804 to the output 812.

In some embodiments, the method also includes coupling the first switch 802 and the second switch 804 to the output 812 through an optical coupler 810. In some embodiments, connecting and disconnecting each of the first optical path and the second optical path from the output 812 involves switching between states of the first switch 802 and the second switch 804, respectively. In some embodiments, each of the switches 802, 804 is a SOA. In some embodiments, switching between states of a SOA to disconnect an optical path from the output 812 involves reverse-biasing the SOA. In some embodiments of the method of FIG. 11, tuning the tunable components 102, 104 involves tuning a frequency of the tunable components 102, 104.

In some embodiments, a non-transitory computer readable medium comprising instructions for execution by a processor may be provided to control execution of the method illustrated in FIG. 7 or FIG. 11, to implement another method described above, and/or to allow the implementation and/or operation of an apparatus described above. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which can be, for example, a compact disc read-only memory (CD-ROM), USB flash disk, or a removable hard disk.

The previous description of some embodiments is provided to enable any person skilled in the art to make or use an apparatus, method, or processor readable medium according to the present disclosure. Various modifications to these embodiments will be readily apparent to those skilled in the art, and the generic principles of the methods and devices described herein may be applied to other embodiments. Thus, the present disclosure is not intended to be limited to the embodiments shown herein but is to be accorded the widest scope consistent with the principles and novel features disclosed herein.

What is claimed is:

1. An apparatus comprising:
    a first optical path having a first tunable component and a second optical path having a second tunable component;
    a first switch component configured to selectively connect the first optical path to an output;
    a second switch component configured to selectively connect the second optical path to the output;
    a controller configured to control the first switch component and the second switch component to select which optical path is connected to the output and to control tuning of the tunable component in the optical path that is not connected to the output.

2. The apparatus of claim 1, further comprising an optical coupler configured to couple the first switch component and the second switch component to the output.

3. The apparatus of claim 2, wherein the optical coupler is a 3dB directional coupler.

4. The apparatus of claim 1, wherein each switch component is a semiconductor optical amplifier (SOA).

5. The apparatus of claim 4, wherein each SOA is selectively configurable by the controller for reverse biasing.

6. The apparatus of claim 1, wherein each switch component has a switching time of less than 1 nanosecond.

7. The apparatus of claim 1, wherein the controller is configured to alternate between selecting the first tunable component and selecting the second tunable component.

8. The apparatus of claim 1, wherein each tunable component is configured to be tunable in optical frequency.

9. The apparatus of claim 1, wherein each tunable component is a tunable laser.

10. The apparatus of claim 9, wherein each tunable laser is a distributed Bragg reflector (DBR) laser.

11. The apparatus of claim 9, wherein each tunable laser is a modulated grating Y-branch (MG-Y) laser.

12. The apparatus of claim 1, wherein the switch components and the tunable components are monolithically integrated on a single integrated circuit (IC) chip.

13. The apparatus of claim 12, wherein the IC chip is mounted on a carrier, the carrier also having mounted at least one of: an optical coupler that couples the first switch component and the second switch component to the output or a thermistor.

14. An optoelectronic package comprising:
a first tunable laser coupled to a first semiconductor optical amplifier (SOA), the first SOA configured to suppress light from the first tunable laser;
a second tunable laser coupled to a second SOA, the second SOA configured to selectively suppress light from the second tunable laser;
an optical coupler having inputs connected to outputs of the first and second SOAs and having an output connected to an output of the package; and
a controller configured to control the first SOA and the second SOA to select which tunable laser is to have light suppressed and to control tuning of the tunable laser that has light suppressed.

15. A method comprising:
connecting a first optical path having a first tunable component to an output;
disconnecting a second optical path having a second tunable component from the output;
transmitting a signal from the first tunable component to the output;
while the second optical path is disconnected from the output, tuning the second tunable component;
after tuning the second tunable component, connecting the second optical path to the output and disconnecting the first optical path from the output; and
transmitting a signal from the second tunable component to the output.

16. The method of claim 15, wherein:
connecting and disconnecting the first optical path from the output comprises switching between states of a first switch component; and
connecting and disconnecting the first optical path from the output comprises switching between states of a second switch component.

17. The method of claim 16, wherein each switch component is a semiconductor optical amplifier (SOA).

18. The method of claim 17, wherein switching between states of the first SOA to disconnect the first optical path from the output comprises reverse-biasing the first SOA.

19. The method of claim 16, further comprising coupling the first switch component and the second switch component to the output through an optical coupler.

20. The method of claim 15, wherein tuning the second tunable component comprises tuning a frequency of the second tunable component.

21. The method of claim 15, further comprising tuning the first tunable component while the first optical path is disconnected from the output.

22. An apparatus comprising:
a first optical path having a first tunable component and a second optical path having a second tunable component;
an optical switch configured to selectively connect the first optical path or the second optical path to an input;
a controller configured to control the optical switch to select which optical path is connected to the input and to control tuning of the tunable component in the optical path that is not connected to the input.

23. The apparatus of claim 22, wherein each tunable component comprises a tunable optical filter.

24. The apparatus of claim 23, further comprising a multi-wavelength source coupled to the input.

* * * * *